(12) United States Patent
Papaefthymiou et al.

(10) Patent No.: US 7,622,977 B2
(45) Date of Patent: Nov. 24, 2009

(54) RAMPED CLOCK DIGITAL STORAGE CONTROL

(75) Inventors: Marios C. Papaefthymiou, Ann Arbor, MI (US); Conrad H. Ziesler, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 134 days.

(21) Appl. No.: 11/553,778

(22) Filed: Oct. 27, 2006

(65) Prior Publication Data

US 2007/0096957 A1 May 3, 2007

Related U.S. Application Data

(60) Provisional application No. 60/730,707, filed on Oct. 27, 2005.

(51) Int. Cl.
*H03K 3/356* (2006.01)
*H03K 3/037* (2006.01)

(52) U.S. Cl. .................. 327/208; 327/218; 327/210

(58) Field of Classification Search ................ 327/199, 327/200, 201, 218, 208–213, 333, 51
See application file for complete search history.

(56) References Cited

U.S. PATENT DOCUMENTS

| | | | |
|---|---|---|---|
| 5,023,480 | A | 6/1991 | Gieseke et al. |
| 5,036,217 | A | 7/1991 | Rollins et al. |
| 5,146,109 | A | 9/1992 | Martignoni et al. |
| 5,311,071 | A | 5/1994 | Ueda |
| 5,384,493 | A | 1/1995 | Furuki |
| 5,473,526 | A | 12/1995 | Svensson et al. |
| 5,506,520 | A | 4/1996 | Frank et al. |
| 5,517,145 | A | 5/1996 | Frank |
| 5,526,319 | A | 6/1996 | Dennard et al. |

(Continued)

FOREIGN PATENT DOCUMENTS

EP 1126612 A1 8/2001

(Continued)

OTHER PUBLICATIONS

Ziesler, et al., "A Resonant Clock Generator for Single-Phase Adiabatic Systems", *ISLPED'01*, Aug. 6-7, 2001.

(Continued)

*Primary Examiner*—Dinh T. Le
(74) *Attorney, Agent, or Firm*—Lempia Braidwood LLC

(57) ABSTRACT

Disclosed herein are digital systems and methods for use with a ramped clock signal. The digital system includes an input element having a data input to receive a data signal, a control input to receive a control signal, and a dynamic node to be driven by the ramped clock signal. The digital system further includes a static memory element having an input at the dynamic node and is configured to reside in an operational state in accordance with the data signal and the ramped clock signal. The input element further includes a switch coupled to the control input to condition updating of the operational state based on the control signal without decoupling the ramped clock signal from the dynamic node. In this way, distribution and delivery of the ramped clock signal to the digital system is continued to facilitate recovery of clock signal energy from the digital system.

22 Claims, 11 Drawing Sheets

U.S. PATENT DOCUMENTS

| | | | |
|---|---|---|---|
| 5,559,478 A | 9/1996 | Athas et al. | |
| 5,587,676 A | 12/1996 | Chowdhury | |
| 5,734,285 A | 3/1998 | Harvey | |
| 5,838,203 A | 11/1998 | Stamoulis et al. | |
| 6,037,816 A | 3/2000 | Yamauchi | |
| 6,069,495 A | 5/2000 | Ciccone et al. | |
| 6,278,308 B1 | 8/2001 | Partovi et al. | |
| 6,323,701 B1 * | 11/2001 | Gradinariu et al. | 327/109 |
| RE37,552 E | 2/2002 | Svensson et al. | |
| 6,563,362 B2 | 5/2003 | Lambert | |
| 6,608,512 B2 | 8/2003 | Ta et al. | |
| 6,742,132 B2 | 5/2004 | Ziesler et al. | |
| 6,777,992 B2 | 8/2004 | Ziesler et al. | |
| 7,215,188 B2 * | 5/2007 | Ramaraju et al. | 327/544 |
| 2001/0013795 A1 | 8/2001 | Nojiri | |

FOREIGN PATENT DOCUMENTS

| | | |
|---|---|---|
| JP | 3756285 | 1/2006 |

OTHER PUBLICATIONS

Athas, William, et al., "Low-Power Digital Systems Based on Adiabatic-Switching Principles," *IEEE Transactions on Very Large Scale Integration (VLSI) Systems*, vol. 2, No. 4, (1994).

Kim et al., "Energy Recovering Static Memory" *ISLPED'02* (2002).

Maksimovic, et al., "Design and Experimental Verification of a CMOS Adiabatic Logic with Single-Phase Power-Clock Supply", *IEEE* (1997).

Ziesler et al., "Energy Recovering ASIC Design," *Proceeding of the IEEE Computer Society Annual Symposium on VLSI* (2003).

Supplemental European Search Report issued in European Application No. 03076979 and mailed May 29, 2006.

International Search Report issued in International Application No. PCT/US03/10320 and mailed Sep. 29, 2003.

* cited by examiner

RAMPED CLOCK DIGITAL STORAGE CONTROL

CROSS-REFERENCE TO RELATED APPLICATION

This application claims the benefit of U.S. provisional application entitled "Low-Power Flip-Flop with Gate Enable and Scan-Chain Enable," filed Oct. 27, 2005, and having Ser. No. 60/730,707, the entire disclosure of which is hereby expressly incorporated by reference.

STATEMENT REGARDING FEDERALLY SPONSORED RESEARCH OR DEVELOPMENT

This invention was made with government support under Contracts Nos. DAAD19-99-1-0304 (Grant No. 038939), DAAD55-97-1-0250 (Grant No. 035782), and DAAD19-03-1-0122 (Grant No. F008602) awarded by the U.S. Army Research Office. The government has certain rights in the invention.

BACKGROUND OF THE DISCLOSURE

1. Field of the Disclosure

The disclosure relates generally to synchronous digital systems and, more particularly, to synchronous digital systems and methods involving a ramped clock signal.

2. Brief Description of Related Technology

Conventional computing systems record and store data via the absence or presence of a voltage (or charge) in a variety of storage devices, including those commonly referred to as flip-flops. The name "flip-flop" is a reference to the binary nature of the device, as each flip-flop can reside in one of two states. A data "write" operation may initially set and then subsequently reset the state of the flip-flop. When a write operation is desired, input signals are provided to the flip-flop to cause a voltage value representation of the desired state to be applied to a latching circuit in the flip-flop that captures the voltage value. The latching circuit holds the voltage (or charge) to maintain the state of the flip-flop in between successive write operations. In the interim, the state of the flip-flop may be accessed in a "read" operation.

A clock signal is used to establish the timing of each data write to a flip-flop. A typical clock signal has an approximately square waveform. The abrupt step changes of each pulse in a square waveform are desirable for driving the gates of transistors in the flip-flop quickly. A flip-flop is often configured to latch (or capture) the data to be stored on the rising edge of each clock pulse. With a square waveform, the rising edge of the pulse may turn the transistors on or off in a relatively quick manner, enhancing the response time (or operational speed) of the computing system.

FIG. 1 depicts an exemplary, alternative flip-flop indicated generally at 10 and configured to be driven by ramped clock signals, rather than a square waveform, as described in U.S. Pat. No. 6,777,992 ("Low-Power CMOS Flip-Flop"), the entire disclosure of which is hereby incorporated by reference. Like other storage devices, the flip-flop 20 is capable of storing an input value DT at an internal node QT. At the same time, the complement of DT, which is DF, is stored at an internal node QF. The state of node QT is updated in synchrony with a clock signal PCLK. In operation, the flip-flop 10 may receive either a traditional square or ramped clock signal. While the flip-flop may operate with either type of clock waveform, when a ramped clock signal is used, clock signal energy may be recovered from the clock distribution network (including the flip-flop 10) as described in the above-referenced patent.

The flip-flop 10 operates as follows. The data input DT becomes stable at a suitable time before the rising edge of the clock signal PCLK. As the clock signal rises, the cross-coupled PFET devices sense and differentially determine the voltages on the internal nodes XT and XF based on the value of DT. Since the cross-coupled NOR gates form a set/reset latch, a positive pulse on either XT or XF causes the latch to either set or reset, respectively. When DT is not changing, either XT or XF will remain low, with the other node changing in phase with PCLK.

When a ramped clock waveform is used to drive the flip-flop 10, clock energy is recovered from the flip-flop 10 regardless of the state of the latch. As described in the above-referenced patent, charge is transferred to and from the clock signal PCLK in an energy-efficient manner. Briefly stated, the clock distribution network includes an inductor configured to cooperate with the parasitic capacitance of each flip-flop and the clock distribution network to support resonant distribution of the clock signal both to and from the flip-flop 10.

With all of the flip-flops in the network operating, the capacitance of the clock distribution network remains relatively stable. In this way, the inductor provides the appropriate amount of inductance for resonant distribution of the clock signal at the desired frequency. Conversely, if the capacitance were to be modified significantly due to, for instance, interruption of clock signal delivery to one or more flip-flops, then the total capacitance of the network would change, and the clock signal would fall out of resonance. The efficiency of the system would therefore decline, as the distribution of the clock signal would thus recover less energy from the network. The efficiency of the clock energy recovery would also decline unless ideal, zero-resistance switches were used to effectuate the clock signal interruptions.

However, clock signal delivery has often been interrupted to save power. In a typical case, the clock signal is choked at a high level in the distribution network, cutting distribution to entire domains of flip-flops. In other cases, the clock signal has been gated on an individual flip-flop basis. For example, the clock signal may be fed to a NAND gate coupled to the flip-flop. In either case, the clock signal fails to reach the flip-flop, and the capacitance of the distribution network may significantly change.

A pipeline of flip-flops may implement a different power saving technique. In the past, the output of a flip-flop in the pipeline has been fed to a multiplexer to provide the option of disregarding the state of the flip-flop, effectively stalling the pipeline. The pipeline may be stalled for a variety of reasons, but avoiding the unnecessary toggling of downstream flip-flops and combinational logic may also result in power savings.

Unfortunately, conditioning the output of a flip-flop may only be suitable in special configurations of memory cells (e.g., a pipeline). Moreover, even though the clock signal may still be distributed throughout the pipeline, at least some flip-flops in the system (e.g., the flip-flop feeding the multiplexer) are still consuming power.

SUMMARY OF THE DISCLOSURE

In accordance with one aspect of the disclosure, a digital system for use with a ramped clock signal includes an input element and a static memory element. The input element includes a data input to receive a data signal, a control input to receive a control signal, and a dynamic node to be driven by the ramped clock signal. The static memory element has an input at the dynamic node and is configured to reside in an operational state in accordance with the data signal and the ramped clock signal. The input element further includes a switch coupled to the control input to condition updating of the operational state based on the control signal without decoupling the ramped clock signal from the dynamic node.

In some cases, the switch includes a transistor having a gate coupled to the control input. The input element may include a complementary pull-down tree as an input data path to the dynamic node for the data signal, such that the complementary pull-down tree is decoupled to ground by the transistor based on the control signal to disable the input data path. Alternatively or additionally, the input element includes a pull-up path coupled to the dynamic node for precharging the dynamic node based on the ramped clock signal, such that the transistor disables an input data path for the data signal without decoupling the pull-up path and the dynamic node.

In some embodiments, the input element further includes a logic gate to receive the control signal and a further control signal to reset the operational state of the static memory element. Alternatively or additionally, the input element further includes a combinational logic circuit to drive the switch and a pull-down tree as an input path to the dynamic node for the data signal. The combinational logic circuit may then include a test data input to receive test data, and a test-enable input to cause the operational state of the static memory element to reflect the test data when the input path is disabled by the switch based on the control signal.

The dynamic node may be coupled to the static memory element such that a parasitic capacitance of the static memory element promotes distribution of the ramped clock signal. The ramped clock signal may provide both timing information and power to the static memory element. The digital system may include a memory cell having the input element and the static memory element such that the logic element is embedded within the memory cell.

In accordance with another aspect of the disclosure, a method is useful for controlling a digital system having a static memory element configured to reside in an operational state. The method includes delivering a data signal to the digital system, and distributing a ramped clock signal to the digital system. The ramped clock signal determines when an update of the operational state can occur in accordance with the data signal. The method further includes sending a control signal to the digital system to restrict the update of the operational state without decoupling the ramped clock signal from the digital system.

The control signal may causes the update of the operational state of the digital system to occur at a frequency derived from the ramped clock signal. Alternatively or additionally, the control signal may be directed to enabling a test procedure. The method may then include distributing a scan clock signal for reception by the digital system in connection with the test procedure.

In some cases, the digital system includes a logic element coupled to the static memory element and to which the control signal is provided in the sending step. The digital system may alternatively or additionally include a flip-flop memory cell having the logic element and the static memory element such that the logic element is embedded within the flip-flop memory cell.

In accordance with yet another aspect of the disclosure, a method is useful for controlling a memory cell of a digital system, the memory cell having a static memory element configured to reside in an operational state based on a data signal. The method includes distributing a ramped clock signal for delivery to the digital system. The ramped clock signal provides timing information for the memory cell to determine when an update of the operational state can occur. The method further includes disabling the memory cell to prevent the update of the operational state based on the data signal by sending a control signal to the memory cell, and continuing the delivery of the ramped clock signal to the memory cell during the disabling step to facilitate recovery of clock signal energy from the digital system.

In some cases, the disabling step is performed at a periodic rate determined by the control signal such that an output of the memory cell has a scaled down frequency derived from the ramped clock signal. Alternatively or additionally, the method further includes providing a test signal to the memory cell.

In some embodiments, the ramped clock signal used by the disclosed methods and systems also provides power to the memory cell. Alternatively or additionally, the ramped clock signal may have a sinusoidal waveform. The disclosed digital systems may also include a clock distribution network through which the clock signal is delivered to the memory cell.

In some cases, the memory cell includes an input element, and the input element includes a control input to receive the control signal and a dynamic node to receive the ramped clock signal. A switch coupled to the control input may then prevent the update of the operational state by disabling an input data path to the dynamic node in accordance with the control signal.

BRIEF DESCRIPTION OF THE DRAWING FIGURES

For a more complete understanding of the disclosure, reference should be made to the following detailed description and accompanying drawing figures, in which like reference numerals identify like elements in the figures, and in which.

Figure 1:
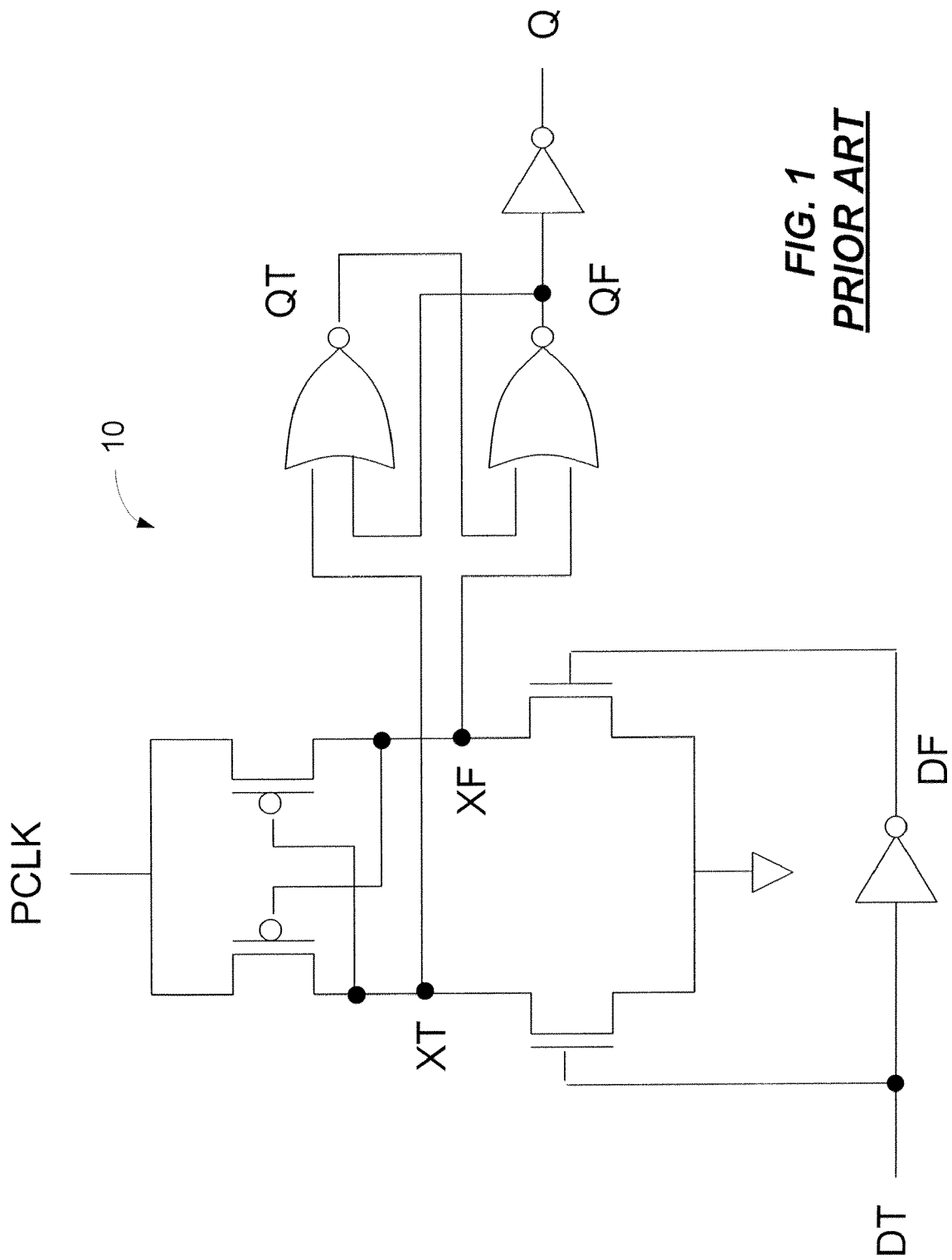
FIG. 1 is a circuit diagram of a prior art flip-flop storage device configured to receive a resonant clock signal.

While the disclosed digital systems and methods are susceptible of embodiments in various forms, there are illustrated in the drawing (and will hereafter be described) specific embodiments of the invention, with the understanding that the disclosure is intended to be illustrative, and is not intended to limit the invention to the specific embodiments described and illustrated herein.

DETAILED DESCRIPTION OF PREFERRED EMBODIMENTS

The disclosed systems and methods generally relate to the control of digital systems and storage devices suitable for use with, and operated in synchrony with, ramped clock signals. As described herein, the disclosed systems and devices are suitable for implementing a variety of methods and control techniques, as the device structures are compatible with a corresponding variety of different logic circuits. The logic circuits may be configured in accordance with the present disclosure to, for instance, implement (i) effective clock gating by disabling a selected storage device individually, (ii) scan testing and other test procedures, and (iii) frequency scaling.

In accordance with one aspect of the disclosure, the devices and methods described below are directed to controlling a flip-flop or other storage device or digital system without interrupting the delivery of a clock signal thereto. Control techniques, such as gating, frequency scaling, testing, clearing, etc., may be implemented without preventing the clock from reaching the storage device or digital system as it would during normal operation. That is, the clock signal still reaches the device even if the control technique involves either disabling a primary data path for the device, or preventing any update of the operational state of the device. Thus, regardless of the operational mode or state of the device or system, the clock signal is allowed to reach the device or system.

As described further herein, allowing the clock signal to reach the device or system uninterrupted facilitates low-power operation of the digital system. The uninterrupted distribution of the clock signal actually results in lower power consumption due to the energy-recovery capabilities of the disclosed devices and systems. Briefly stated, clock energy is recycled and recovered (rather than dissipated) via distribution throughout the LC network of the clock distribution network. The disclosed techniques and designs ensure that the clock signal sees the entire LC network to thereby achieve the most efficient distribution.

Although well-suited for and described in connection with flip-flop storage device designs, the disclosed devices and methods are compatible with a variety of clocked storage devices and digital systems. For example, the disclosed techniques and device designs may be utilized with master-slave, edge-triggered architectures, or level-clocked architectures. Furthermore, practice and implementation of the disclosed methods and systems are not limited to any particular clock distribution network design or, for instance, a certain configuration of memory cells.

In accordance with one aspect of the disclosure, a synchronous digital system having clocked storage (e.g., flip-flops, latches, clocked memory arrays) is controlled by a combination of at least one non-traditional, or ramped, digital waveform, as well as a variety of traditional and/or non-traditional digital waveforms. The ramped, non-traditional digital waveforms include sinusoidal and saw-tooth waveforms, as well as waveforms generated with energy/charge recycling methods, pseudo-sinusoidal waveforms, and inductor-driven waveforms. The non-traditional digital waveforms may be utilized in connection with traditional clock and control waveforms, and the distribution network used to deliver them may be time-multiplexed or otherwise controlled to deliver both non-traditional and traditional digital waveforms, depending on the operational context.

The ramped, non-traditional digital waveforms of the clock signals utilized by the disclosed systems and methods facilitate resonant distribution throughout the clock distribution network. To that end, the clock signals may be either sinusoidal or otherwise ramped in the sense that the waveform has relatively significant rise and fall times. Such rise and fall times are in contrast to the approximately square pulses of a traditional clock signal. In some embodiments, the ramped clock signals may be approximately sinusoidal shape and approximately constant amplitude. More generally, the ramped clock signals can be generated and implemented as the steady-state waveform obtained by a resonant LC system that performs a forced oscillation with a driver frequency relatively close (e.g., within 50%) to its natural frequency. For an example of a resonant LC system, please see the power clock described in Ziesler et al., "A Resonant Clock Generator for Single-Phase Adiabatic System," *ISLPED, pp.* 159-164 (2001), the entire disclosure of which is hereby incorporated by reference.

In some cases, the disclosed systems and methods may also utilize a ramped clock signal with a non-constant amplitude. For example, suitable ramped clock signals may exhibit a decaying amplitude obtained from the transient behavior of the clock distribution network and, more generally, the digital system. The decaying amplitude may result from the gradual dissipation occurring over time as the clock signal is distributed throughout the clock distribution network. At some desired point, the clock generator may replenish the clock signal to restore a certain signal amplitude.

More generally, the ramped clock signals suitable for use with the disclosed devices and methods may be (1) generated with recycling methods, (2) sinusoidal or pseudo-sinusoidal, (3) inductor-driven, or (4) simultaneously some combination of the foregoing. A waveform is generated with energy/charge recycling methods, if the energy used to affect some single "high"-to-"low"-to-"high" cycling (or "low"-to-"high"-to-"low" cycling) of the waveform's digital state is somehow reclaimed and reused to affect some subsequent "high"-to-"low"-to-"high" (or "low"-to-"high"-to-"low" cycling) of the waveform's digital state in such a fashion that the energy dissipated in each "high"-to-"low"-to-"high" cycling (or "low"-to-"high"-to-"low" cycling) is appreciably below $(\frac{1}{2})CV^2$, where C is the capacitance of the network distributing the waveform, and V is the voltage difference between the "high" and "low" digitals states of the waveform. Pseudo-sinusoidal waveforms include waveforms that are either (1) sinusoids, (2) made up of a series of sinusoidal pulses, or (3) by physical design/structure of their generating circuits/systems, reasonably expected to approximate the form of either a sinusoid or a series of sinusoidal pulses. Pseudo-sinusoidal waveforms may also include or exhibit "clipped" sinusoidal waveforms, which may result from a variety of factors. An inductor-driven waveform includes any waveform that is beneficially augmented by current and/or voltage provided by an inductance presented by a waveform generator and/or distribution network.

The foregoing examples of ramped clock signals and other waveforms are in contrast to traditional digital waveforms, such as the industry-standard "square" waveforms generated by alternately connecting networks to stable voltage supplies via the source-to-drain paths of semiconductor transistors, and "slew limited" waveforms that might result when waveform generators deviate from an ideal square to provide additional noise margin, current limiting, overshoot limiting, various other operational requirements, and/or reduced generator complexity. Such waveforms are not considered to be generated with energy/charge recycling methods, because the energy dissipated in a single "high"-to-"low"-to-"high" cycle of the waveform is approximately equal to (or possibly in excess of) $(\frac{1}{2})CV^2$, where C is the capacitance of the network distributing the waveform, and V is the voltage difference between the "high" and "low" digital states of the waveform. Such waveforms are not considered to be pseudo-sinusoidal, because the shape of the waveform would approximate a series of trapezoidal pulses in the ideal case where the capacitance of the network distributing the waveform were zero, or the resistance of the transistors connecting the network to the stable voltage supplies were zero; i.e., the waveform is neither an amplified sinusoid, an amplified sinusoid pulse, nor intended to be an approximation of an amplified sinusoid or an amplified sinusoidal pulse. Finally, such waveforms are not considered to be inductor-driven, because they are not beneficially augmented by current and/or voltage provided by the inductance of presented by a waveform generator and/or distribution network.

Further information regarding a ramped clock generator suitable for use with the disclosed methods and systems is set forth in U.S. Pat. No. 6,742,132 ("Method and Apparatus for Generating a Clock Signal Having a Driven Oscillator Circuit formed with Energy Storage Characteristics of a Memory Storage Device") and U.S. Pat. No. 6,777,992 ("Low-Power CMOS Flip-Flop"), the entire disclosures of which are hereby incorporated by reference. Practice of the disclosed methods and systems is, however, not limited to any one clock generation technique or design.

As described below, the disclosed digital systems and methods are configured for use with a clock source that provides a ramped clock signal. While the details of the clock source are not germane to the present disclosure, the ramped clock source facilitates low-power operation of the digital systems through clock energy recovery and recycling. Such energy recovery is achieved in spite of the disclosed techniques, some of which may involve disabling storage devices, while still facilitating uninterrupted clock signal distribution (including to those devices that have been disabled).

Figure 2:
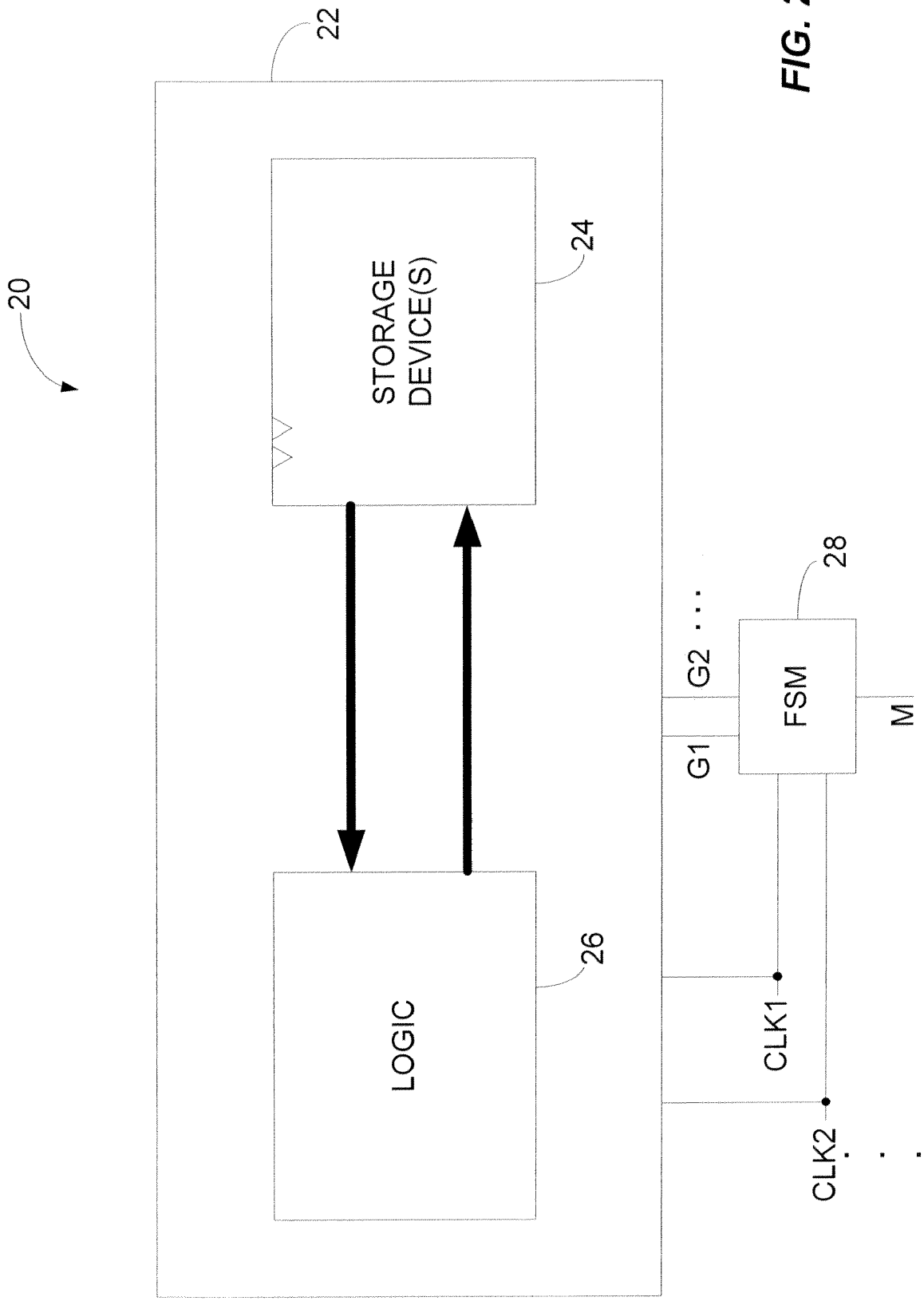
FIG. 2 is a block diagram of a digital system in accordance with one aspect of the disclosure.

With reference now to the drawing figures, FIG. 2 depicts a block diagram of a digital system indicated generally at 20. The digital system 20 may be arranged in an architecture having any number of cells or units 22, such as memory cells, each of which, in turn, may have any number of storage devices 24 coupled to a logic element or circuit 26. Each storage device 24 is a clocked device, updated in synchrony with one or more clock signals, while the logic 26 may, but need not, include any clock-driven circuitry. In any case, the logic 26 provides one or more signals to the storage device(s) 24 to control (e.g., condition) the operation of the storage device(s) 24. Similarly, and as described in greater detail below, the storage device(s) 24 may provide feedback and other signals to the logic 26 in order to, for instance, maintain or update an operational state.

In some cases, a transistor, gate, logic element or other element within one component of the cell 22 may be considered to be involved in the implementation of tasks associated with another or multiple components of the cell 22, i.e., both the storage device 24 and the logic 26. Indeed, some elements may be shared by the storage device 24 and the logic 26. Thus, the characterization or assignment of elements to the components of the cell 22 may be context-dependent and otherwise subject to varying perspective.

Some elements of the logic 26 may be shared by a large number of storage devices 24, as desired. In fact, the logic 26 (or any component thereof) of one cell 22 may be shared across a number of cells (or domains of cells).

Nonetheless, the logic 26 may be considered logic embedded with the clocked storage devices 24. As described below in connection with several exemplary embodiments, the logic 26 may be embedded within a storage device 24 as part of an input element of a static storage element. Generally speaking, the input element may integrate the elements of the logic 26 with the circuitry responsible for accepting the set of input signals relied or acted upon to update or control the operational state of the storage element. Such circuitry may include header or pull-up elements to power supplies (including power clock signals, as shown), as well as footer or pull-down elements to ground, and any portion of the embedded logic 26 may integrated therewith to accept the input signals. In addition to the data signals, the input signals may include a variety of control signals, such as gating signals and enabling signals to selectively store data. These control signals can be square or non-square ideal waveforms and are generated by appropriate control circuitry, such as a finite state machine (FSM) that can reside in a plurality of modes.

In the exemplary embodiment shown, the set of signals provided to the digital system 20 include, for example, any number of clock signals (CLK1, CLK2, etc.), any number of data signals, enable/disable signals, as well as set, reset, scan-data, scan-enable and other control signals, as described further below. The control signals are shown for simplicity in illustration as gating (or control) signals G1, G2, etc.

As shown in FIG. 2, the digital system 20 may include a finite state machine (FSM) 28 or other controller to generate one or more of the gating signals G1, G2, etc, in response to a mode control signal M. The FSM 28 may alternatively be integrated with a separate digital processing system (not shown) in communication with the digital system 20. In either case, the FSM 28 and the gating signals generated thereby may be shared by any number of digital systems, cells or units.

In operation, the clock signals CLK1, CLK2, etc. are used to provide synchronization for one or more components or aspects of the digital system 20. For example, the clock signal CLK1 may be a ramped clock signal serving as the main clock signal synchronizing all storage devices and units (e.g., flip-flops) during all modes of operation, including when the system is actively computing. The clock signal CLK2 (which may or may not be synchronized to the clock signal CLK1) may be used during selected modes of operation, including, for instance, for enabling the scanning of test data into the storage device(s) 24 (e.g., flip-flops) in accordance with one aspect of the disclosure. The gating (or control) signals G1, G2, etc. may be used to facilitate and/or enable the conditional latching of data into the storage device(s) 24 of the system. For example, the control signal G1 may be used to selectively disable the latching of new data into the storage device 24 to which it is provided. The control signal G2 may be used to enable the scanning of test data into the storage device 24 to which it is provided.

A variety of storage device designs are suitable for use in, and compatible with, the digital system of FIG. 2. FIGS. 3-11 present exemplary, low-power flip-flop structures or designs that may implement energy recovery techniques while configured in accordance with FIG. 1. The embodiments shown in FIGS. 3-6 rely on a ramped clock signal for both timing information and power, while the embodiments of FIGS. 7-11 rely on a ramped clock signal only for timing information. More generally, the flip-flop structures and designs include both an input element and a state element to address the functionality of the logic 26 and the storage device 24, respectively. Implementation of such functionality may include gating techniques, scanning of test data, frequency scanning, and other control techniques. As the following flip-flop structures are exemplary in nature, variations therefrom may be made to both the components and connections shown and described in accordance with the knowledge of one skilled in the art.

Figure 3:
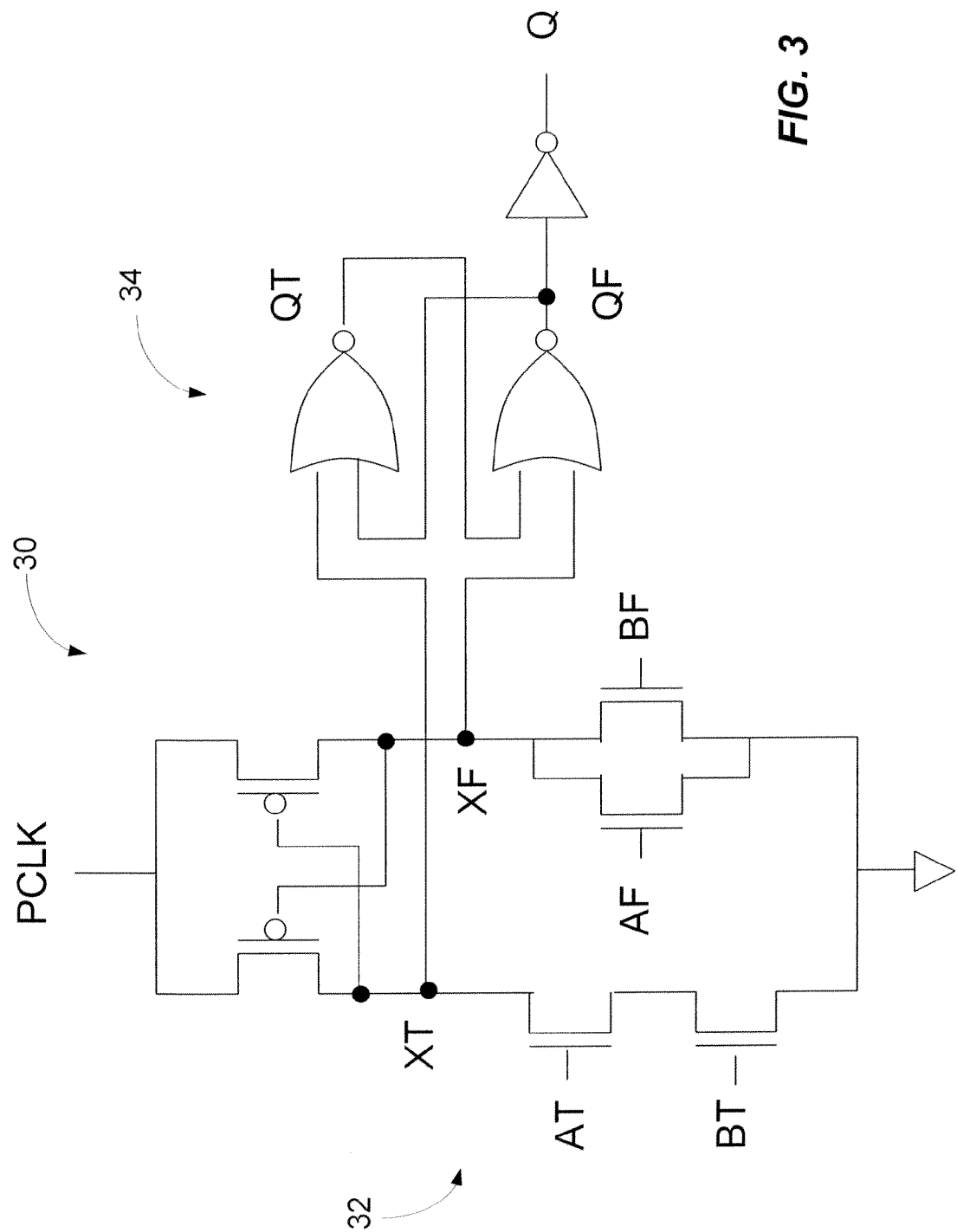
FIG. 3 is a circuit diagram depicting one or more portions of the digital system of FIG. 2 in greater detail and in accordance with an embodiment having a combinational logic pull-down tree.

With reference now to FIG. 3, an exemplary digital system indicated generally at 30 and responsive to a control or data signals A and B, which are provided via their complementary values AT and AF, and BT and BF. The digital system 30 includes an input element and a static memory element generally indicated at 32 and 34, respectively. The input element 32 includes a header element having inputs for the control, data and clock signals, as well as a pull-down tree to incorporate logic functionality. In this case, the pull-down tree includes complementary pull-down paths that compute the logic function F=AT AND BT and its complement. In this exemplary embodiment, the result of the function computation is stored in a node QT of the memory element 34 in synchrony with the clock signal PCLK.

The input element 32 of the digital system 30 shown in FIG. 3 (as well as the other systems and storage devices described below) acts as a sense-amplifying header structure for the digital system, the outputs of which drive the operation of the static memory element 34, thereby determining its operational state. In some exemplary cases, the memory element 34 includes a pair of cross-coupled NOR gates, but other configurations and architectures may be used.

The complementary pull-down paths may be considered to provide logic functionality embedded within the memory cell. To that end, each pull-down path includes a switch (e.g., an NMOS transistor) coupled to a control input (e.g., AT, AF, BT, BF) to help implement the logic functionality. Generally, the switch conditions the updating of the operational state based on the control signal received via the respective control input.

Each pull-down path is coupled to respective inputs to the memory element 34 at a pair of internal nodes XT and XF, which serve as the interface between the input element 32 and the memory element 34. That is, the input element 32 is coupled to the memory element 34 at the nodes XT and XF.

During operation, and as described in the above-referenced patents and materials, one of the internal nodes XT and XF acts as a dynamic node that is driven by and, in this case, floats with, the clock signal PCLK. In this embodiment, the other node is pulled to ground via one of the pull-down paths. To these ends, the switches (e.g., transistors) in the pull-down paths act as decoupling switches to couple and decouple the pull-down paths to ground based on the control signal(s), but without decoupling the ramped clock signal from the dynamic nodes XT and XF. As one of the nodes XT and XF is still driven by, and floating with, the clock signal at an input to the memory element 34, the input element 32 presents, via one dynamic node, the parasitic capacitance of the memory element 34 to the clock signal PCLK. The clock signal PCLK thus alternately reaches one of the nodes XT and XF as the operational state of the memory element 34 is toggled or updated. In this way, the parasitic capacitance of the memory cell is presented to the clock signal PCLK regardless of the operational state of the system 30. In other words, distribution of the clock signal reaches the dynamic node within each memory cell without interruption. The clock distribution network is thus ensured to include the parasitic capacitance of the digital system 30, and the LC network is unaffected by the operational state of the memory element 34.

Either one (or both) of the generic signals A and B may be considered the source of data to be stored in the digital system 30. Similarly, either one (or both) of the signals A and B may be considered a control signal to condition the storage of data in the digital system 30 and, thus, any updating of the operational state of the memory element 34 thereof. In any case, the responsiveness of the embedded logic to the signals A and B facilitates operation of the digital system 30 as an efficiently controlled flip-flop. That is, the incorporation of additional control functionality into the flip-flop has not impacted its ability to facilitate the recovery and efficient distribution of the clock signal.

More generally, the pull-down (or, more generally, evaluation) tree of the input element 32 may support or compute a variety of different logic functions, and need not be limited to the embedded dual-rail AND gate shown in the embodiment of FIG. 3. Functions that are suitable for generating complemented inputs in the pull-down tree of the input element 32 may be more easily and efficiently realized than others.

Figure 4:
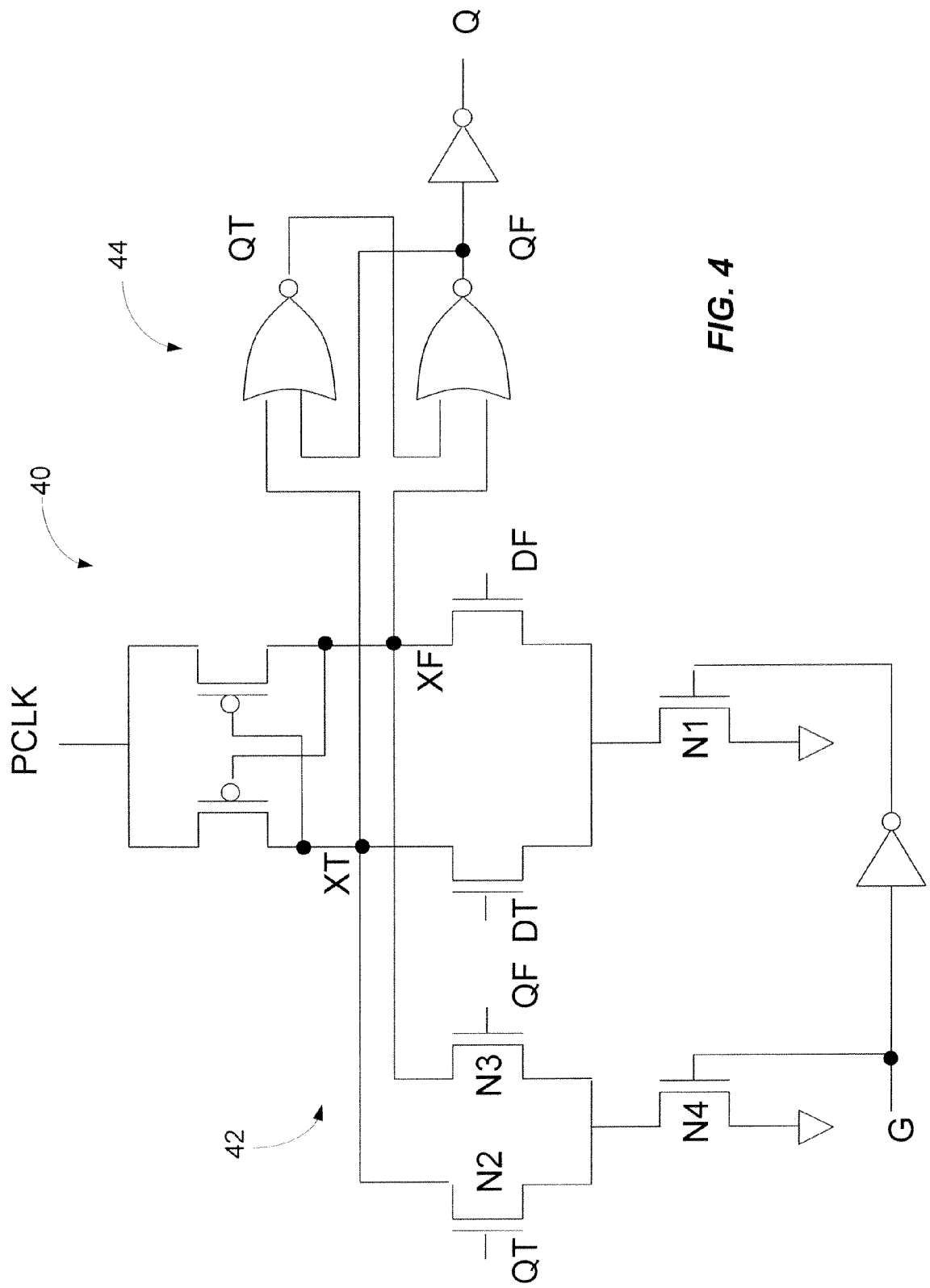
FIG. 4 is a circuit diagram depicting one or more portions of the digital system of FIG. 2 in greater detail and in accordance with another embodiment having a gated storage device responsive to a control signal.

FIG. 4 depicts a digital system having a flip-flop storage device indicated generally at 40. The storage device 40 is similar to the digital system 30 shown in FIG. 3, inasmuch as the storage device 40 also includes input and memory elements indicated generally at 42 and 44, respectively. The input element also similarly includes embedded logic. In this case, the embedded logic includes a gating construct having footer transistors N1 and N4 coupled to respective, complementary evaluation trees. Feedback paths from QT and QF drive one of the evaluation trees, specifically at the gates of transistors N2 and N3, respectively. The embedded logic of the input element 42 also involves the two pull-down (or footer) NFET devices N4 and N1, which are driven by a control (or gating) signal G and its complement GF, respectively, and thus serve as the above-described decoupling switches for each evaluation tree. When the control signal G is sent to the storage device 40, the memory element 44 ignores its data input DT (even if the clock rises) and retains its current state. As with the foregoing embodiments, however, the control signal G conditions the updating of the operational state of the memory element 44 using switches (i.e., transistors N1 and N4) that avoid decoupling the clock signal from the dynamic nodes. Accordingly, the clock signal PCLK continues to drive one of the internal dynamic nodes XT and XF even when the data input path is disabled, the reception of which helps to maintain clock energy recycling.

In some cases, the inverter shown in the gating construct may be shared among multiple flip-flop storage devices, as desired.

In accordance with one aspect of the disclosure, the gating construct in the flip-flop storage device 40 of FIG. 4 may be used to achieve a technique that effectively gates the clock signal PCLK, but without interrupting its distribution to the digital system and throughout the clock network. Using the control signal, the gating construct can cause the memory element 44 of the storage device 40 to ignore the data input DT, just as if the clock signal PCLK was not received.

In accordance with another aspect of the disclosure, the gating construct in the flip-flop storage device 40 of FIG. 4 may be used to implement a frequency scaling technique such that the flip flop storage device 40 (and any downstream devices) effectively operates at a frequency derived from the frequency of the clock signal PCLK. Using the control signal G, the gating construct can effectively gate the clock (as described above) for any number of clock cycles, and allow the memory element 44 to update its state every nth cycle. If n=2, then the storage device 40 operates as if its clock signal had a frequency of n/2. Other derivative frequencies (n/4, n/8, etc.) may also be achieved. In this way, frequency-scaled operation can be achieved without changing the frequency of the clock signal PCLK. Other frequency scaling fractions (e.g., ⅓, ⅔, etc.) may also be achieved given the corresponding control signal waveform. With the clock signal set for efficient distribution (e.g., at or near resonance) throughout the LC network formed by the collective parasitic capacitances of the clock network and the clock generator inductance, this technique may enable the operation of one or more storage devices at a slower frequency than the resonant frequency. In some cases, operating the storage device 40 in accordance with this technique may provide a derivative clock signal for one or more entire domains within a digital processing system.

This technique may be useful in connection with digital systems based on a ramped clock signal, as the target operating frequency of the clock is dictated by the resonant frequency of the ensuing LC system. Without this technique, operating at a different frequency would require a change in the natural frequency of the system. Such a change could be accomplished by introducing additional inductive elements, resulting in increased cost, complexity and power dissipation.

Instead, implementation of the above-described frequency scaling technique via the conditional latching of the flip-flops (or other storage devices) allows the main clock to run uninterrupted at its natural (or other desired) frequency. The flip-flops can be selectively enabled for only a subset of the clock edges, thus changing state at a lower aggregate rate and effectively operating at a slower frequency. In an exemplary case, the required control may be realized with an FSM that pre-calculates the fraction of natural-frequency pulses that must be enabled to realize a desired lower aggregate rate, and/or an FSM that maintains one or more counters to determine if or when a desired lower aggregate rate has been met, exceeded, and/or missed, and/or an FSM that disables natural frequency pulses once some overall system state (e.g., "operation completed") has been attained.

The control (or gating) signal G may have a variety of different waveforms to accomplish the above-described disabling (or clock gating) and frequency scaling techniques. In either case, a finite-state machine FSM (see FIG. 2) or other controller may be used to generate the signal G with any desired waveform and at any desired frequency.

Figure 5:
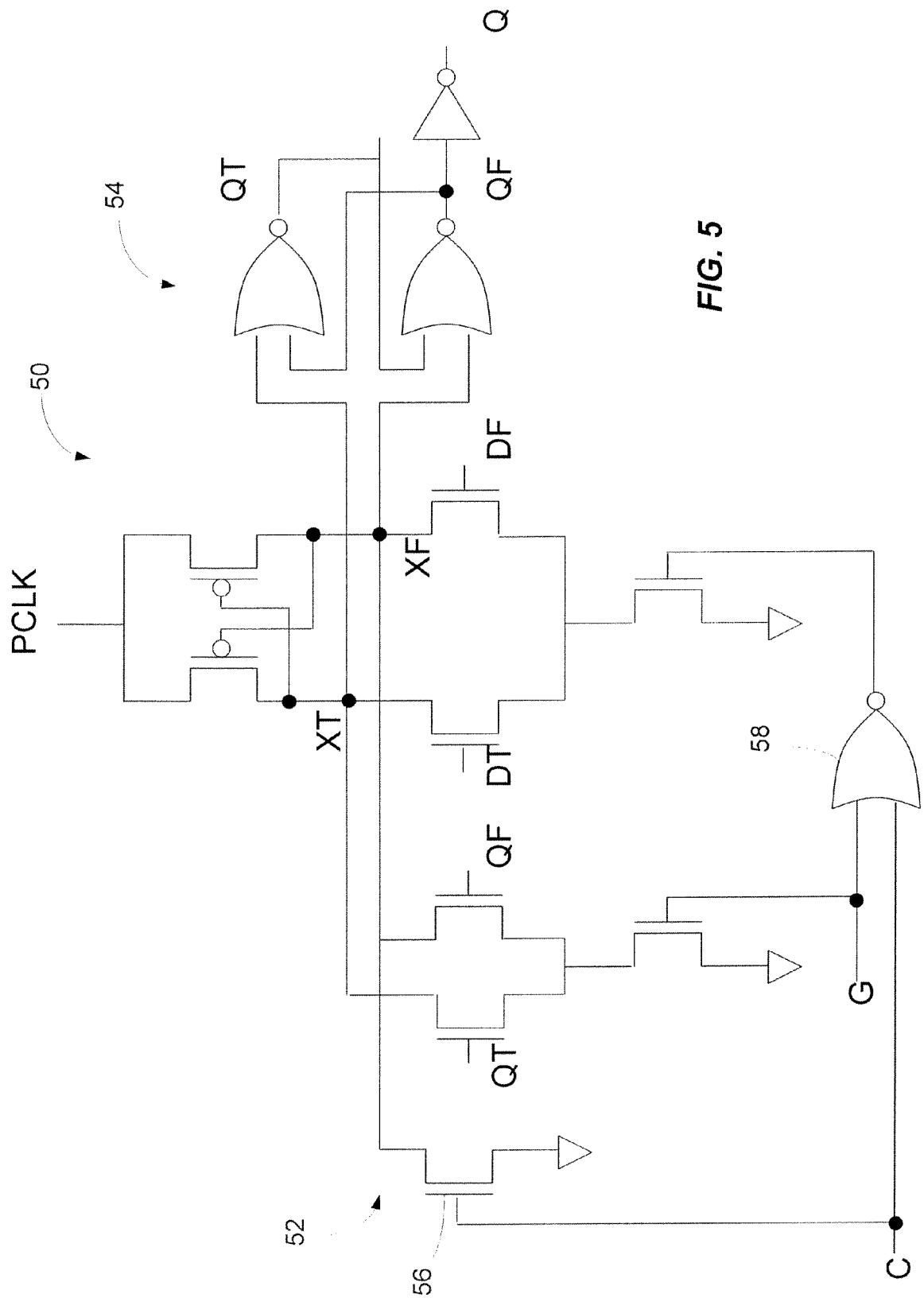
FIG. 5 is a circuit diagram depicting one or more portions of the digital system of FIG. 2 in greater detail and in accordance with yet another embodiment having a gated storage device responsive to a pair of control signals.

FIG. 5 depicts a digital system having an alternative flip-flop storage device indicated generally at 50 with a variation on the gating construct of the previous embodiment. In this variation, an input element indicated generally at 52 receives a further control signal C to provide a clearing functionality to reset the operational state of a memory element indicated generally at 54. The clear control signal C thereby complements the gating signal G, which may still be used to disable the data path for updating the memory element 54, as described above. To these ends, the clear control signal C is applied to an NFET pull-down transistor 56 coupled to one of the dynamic nodes XT and XF, and both control signals C and G are applied to a NOR gate 58 driving a pull-down tree for the data signal input path.

The NOR gate 58 may be shared with other digital systems or storage devices (not shown), as desired. More generally, the logic embedded in the input elements 42 and 52, such as the inverter whose input and output drive the gates of N4 and N1, respectively (see FIG. 4), may be either be duplicated in each flip-flop storage device, or memory cell, or shared among a number of devices or cells.

Figure 6:
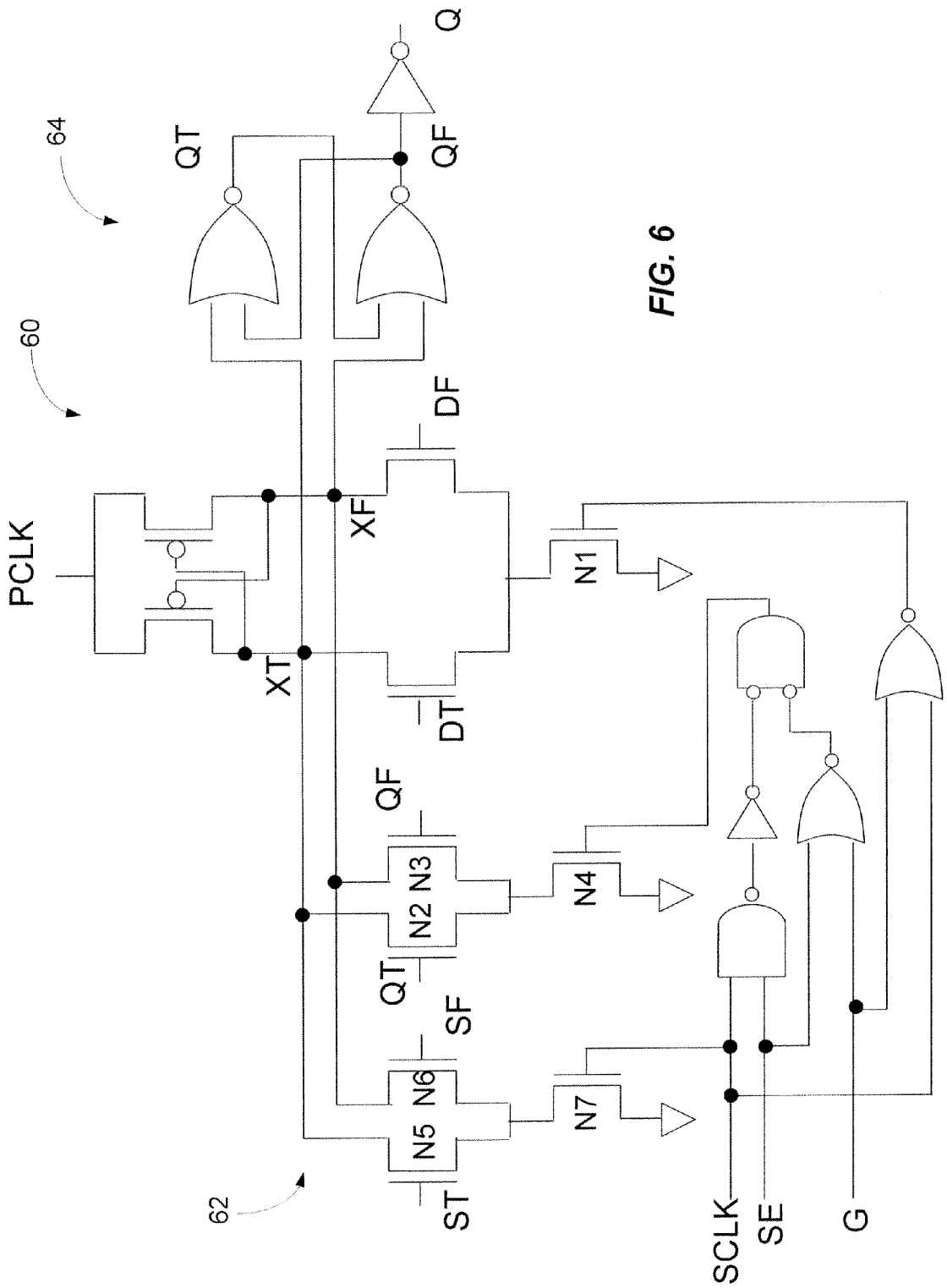
FIG. 6 is a circuit diagram depicting one or more portions of the digital system of FIG. 2 in greater detail and in accordance with an embodiment having a gated storage device responsive to multiple control and clock signals and suitable for use in accordance with an aspect of the disclosure involving a scan test procedure.

With reference now to FIG. 6, a flip-flop storage device indicated generally at 60 may be incorporated within a digital system having a number of such devices connected to form, for example, a serial shift register, or a scan chain, to enable functional testing after manufacturing. Scan chains generally require an alternate path for data to enter the flip-flop. The embodiment shown in FIG. 6 provides this scan capability in accordance with another aspect of the disclosure. In this technique, a footer transistor N1 of an input element indicated generally at 62 is introduced to selectively disable the complementary pull-down trees of the primary data input path (i.e., for the data signal D). The primary data input path is disabled when test data is scanned in or, more generally, when the device 60 is gated. To ensure that the operational state of a memory element indicated generally at 64 is retained while the primary data path is disabled, a pair of NFET devices N2 and N3 of another complementary pull-down tree are driven by the operational state reflected on the internal dynamic nodes XT and XF, respectively, and coupled to an NFET footer device N4. To enable the scanning of test data, a pair of NFET devices N5 and N6 of yet another complementary pull-down tree are driven by the scan data ST and SF, respectively, and coupled to an NFET footer device N7.

In addition to the clock signal PCLK, which is not interrupted during implementation of the scan procedure, a single-phase clock scan signal SCLK is used. When a scan-enable signal SE is provided, it overrides the gating signal G and a "shift" of the scan chain occurs as a scan value is stored into the flip-flop 60. The scan clock SCLK may be either traditional or non-traditional, but may be synchronized with the clock PCLK such that each shift of the scan chain occurs unambiguously with a particular cycle of PCLK. If an ambiguous mapping of shifts to PCLK may be tolerated, the scan clock SCLK may be asynchronous to the clock signal PCLK, and a single shift per SCLK pulse can occur by either introducing additional feedback logic into the flop, or by making SCLK multi-phase (e.g., by running different non-overlapping SCLKs to adjacent flip-flops in the scan chain).

As an alternative to the scan flip-flop in FIG. 6 that uses two clock signals (i.e., PCLK and SCLK), a scan flip-flop may use a single traditional or non-traditional signal PCLK to either provide the clock signal under normal operation or to serve as the scan clock during scan. In this case, the footer N4 is enabled when the flip-flop is gated or as soon as the "shifting" of the scan values has been completed.

Figure 7:
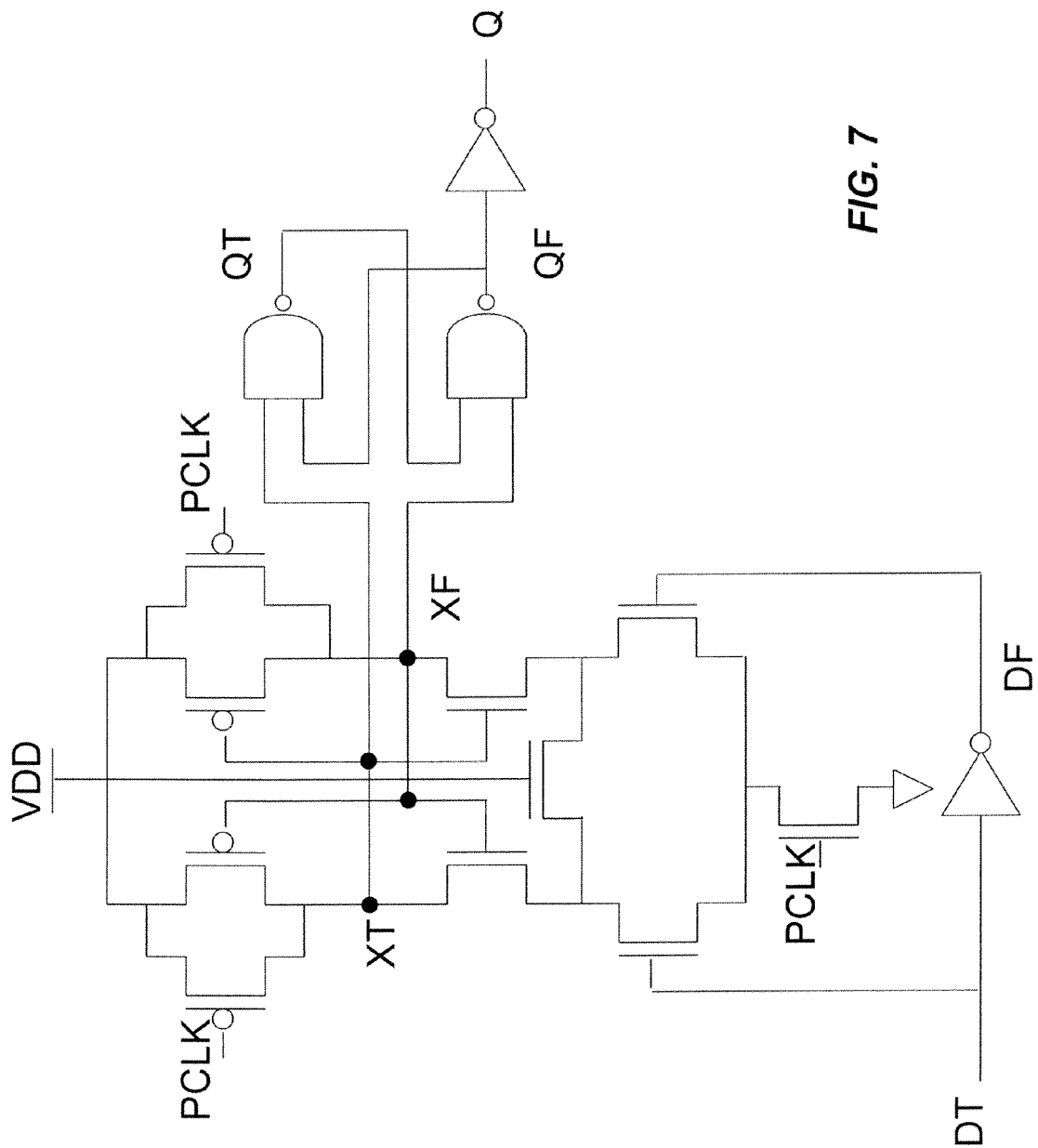
FIG. 7 is a circuit diagram of an alternative flip-flop topology suitable for use with multiple aspects of the disclosure.
Figure 8:
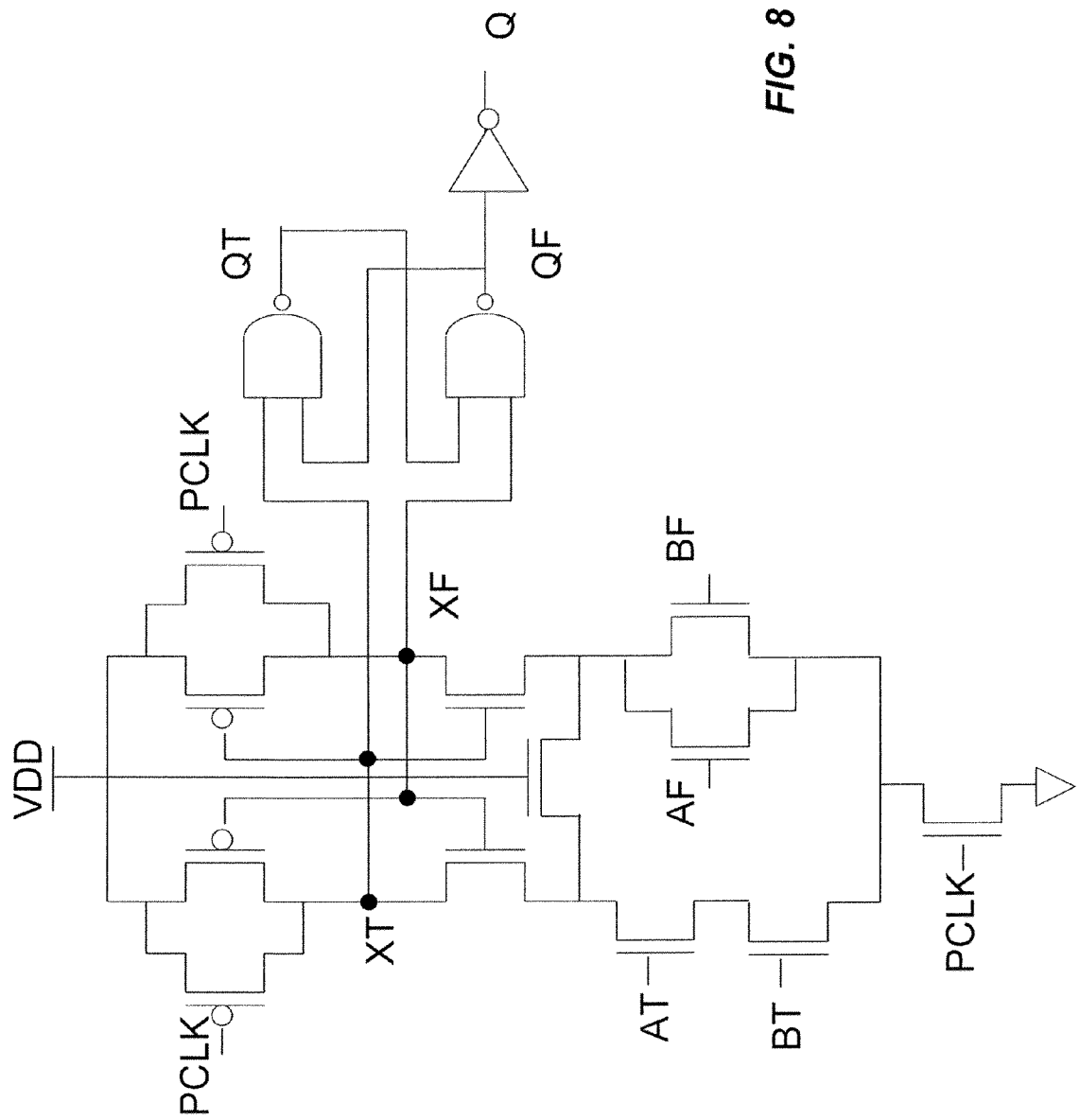
FIGS. 8-11 are further circuit diagrams depicting one or more portions of the digital system of FIG. 2 in greater detail and in accordance with embodiments having gated storage devices based on the alternative flip-flop topology of FIG. 7.
Figure 9:
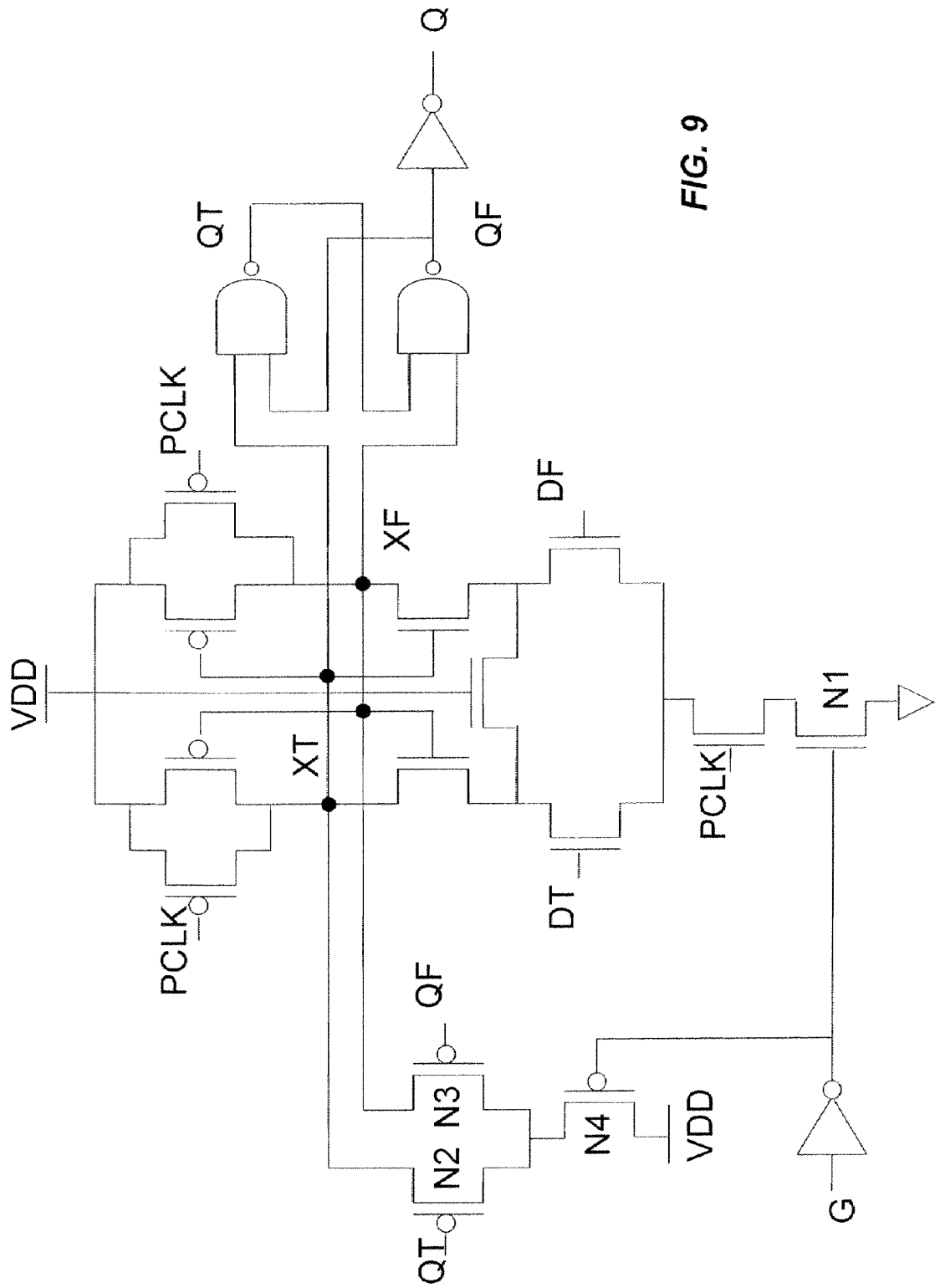
Figure 10:
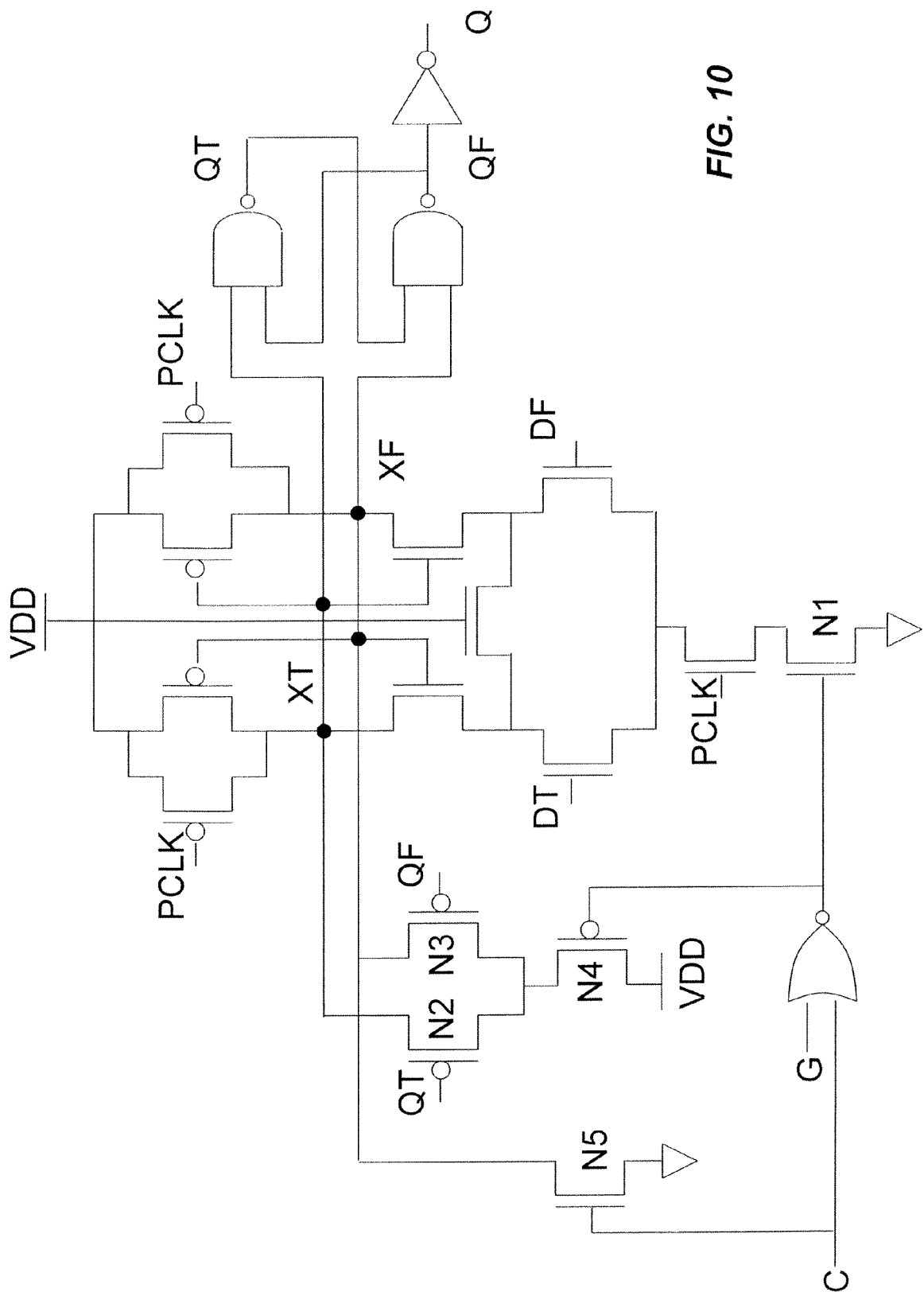
Figure 11:
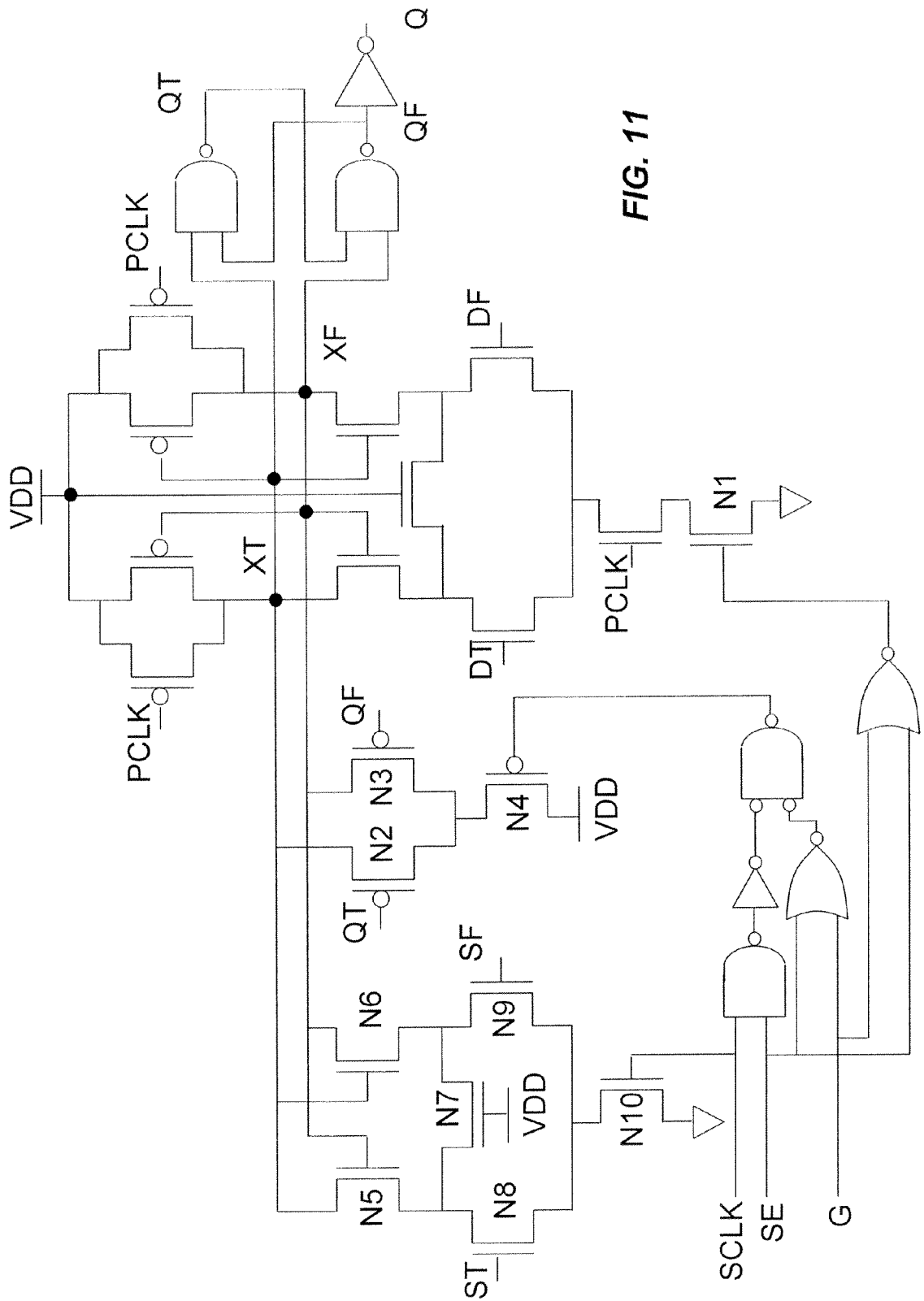

Described above are several exemplary embodiments generally having a energy recovering flip-flop architecture that includes internal, dynamic nodes XT and XF coupled to significant capacitive loads via the respective parallel pull-down structures of the input elements, as well as the NOR gates (or other logic) of the memory elements. During operation, one of the dynamic nodes is directly driven by the ramped clock signal. However, this architecture is not the only one capable of providing suitable capacitive loads to facilitate clock energy recycling in connection with implementing control techniques, such as clock gating, frequency scaling, and scan testing. In fact, the embedded logic, gating, scan and other techniques and methods described in connection with FIGS. 3-6 may be implemented with a variety of alternative flip-flop structures. For example, FIG. 7 depicts an alternative flip-flop design that utilizes a main clock signal only for timing information (rather than for both timing information and power).

Digital systems utilizing this clock signal and based on this alternative flip-flop design are shown in FIGS. 8-11. The digital systems of FIGS. 8-11 are also exemplary in nature, and present the same functionality as the systems shown in FIGS. 3-6. As shown in each of FIGS. 7-11, the main clock signal drives the gates of NFET and PFET devices (as opposed to their drains/sources, as in FIGS. 1 and 3-6. Nonetheless, the main clock signal may still have a ramped waveform, and each design is configured to facilitate energy clock recovery and recycling even when the data updates of the memory element are prevented or disabled. In these cases, however, the ramped clock signal PCLK drives internal, dynamic nodes XT and XF indirectly, inasmuch as the ramped clock signal facilitates the charging of the dynamic nodes XT and XF from the VDD node (as opposed to supplying charge directly). Thus, as used herein, the term "drive" (and any derivatives) is used in a broad sense to include both direct and indirect charging, where indirect charging may involve facilitating, enabling, controlling or otherwise impacting the charging.

As shown in FIGS. 8-11, the input element of the alternative architecture includes a pair of cross-coupled inverters (rather than the cross-coupled PFETs of FIGS. 3-6) to pull the voltages of the dynamic nodes XT and XF in opposite directions, and a pull-up path having an additional pair of PFETs (in parallel to respective PFETs of the cross-coupled inverters) that receive the clock signal PCLK for precharging the dynamic nodes XT and XF of the flip-flop storage device every cycle. In these embodiments, the decoupling switches (e.g., transistor N1) disables an input data path for the data signal without decoupling the pull-up path and the dynamic node.

More generally, the alternative architecture described and shown in connection with the embodiments of FIGS. 8-11 is similar to the architecture described in connection with the embodiments of FIGS. 3-6, insofar as both storage device architectures embed logic in an input element coupled to a memory element at a dynamic node driven by a ramped clock signal, where the input element has one or more switches, such as footer transistors, that are coupled to a control input to condition the updating of the operational state of the memory element without decoupling the ramped clock signal from the dynamic node. In this way, both architectures support the resonant (or near resonant) distribution of ramped clock signals despite the implementation of logic functionality in (or in connection with) the storage devices. With these architectures, control techniques may implemented that would otherwise involve gating or interrupting the delivery of a clock signal to a storage device. In contrast, the disclosed systems and methods involve disabling the storage devices to prevent operational state updates while continuing the delivery of a ramped clock signal thereto.

To the extent that the term "dynamic" is used herein in connection with the characterization of a node, the term is intended to distinguish the node from other nodes or portions of the circuit residing or having a voltage that is effectively fixed, latched or otherwise static. To this end, a dynamic node may have a voltage level that is intended to exhibit transient behavior, as opposed to a voltage level intended to exhibit, for example, step changes (i.e., a square waveform). However, a node characterized as "dynamic" need not be permanently or continuously varying voltage level or other dynamic behavior. On the contrary, a dynamic node may only remain dynamic for as long as the memory cell resides in a specific operational state. Upon a reset or other operation to update the operational state, the dynamic node of the memory cell may change, i.e., shift, to a different node in the circuit. Furthermore, a dynamic node may follow, for instance, a clock signal for only a portion of the clock cycle as a result of clipping or other effects limiting the oscillation of the dynamic node.

The term "data signal" is used herein in a broad sense to include any type of information (a logical "1" or "0", true or false, etc.) that may be stored in the digital system, including information utilized to generate a derivative clock pulse.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

The foregoing description is given for clearness of understanding only, and no unnecessary limitations should be understood therefrom, as modifications within the scope of the invention may be apparent to those having ordinary skill in the art.

What is claimed is:

1. A digital system for use with a ramped clock signal, the digital system comprising:
   an input stage comprising a data input to receive a data signal, a control input to receive a control signal, a clock input to receive the ramped clock signal, and a dynamic output node to be driven by the ramped clock signal; and,
   a static memory stage having an input at the dynamic output node such that an operational state stored in the static memory stage is determined in accordance with the data signal and the ramped clock signal;
   wherein the input stage further comprises a switch coupled to the dynamic output node to condition updating of the operational state based on the control signal without decoupling the ramped clock signal from the dynamic output node.

2. The digital system of claim 1, wherein the switch comprises a transistor having a gate coupled to the control input.

3. The digital system of claim 2, wherein the input stage comprises a complementary pull-down tree as an input data path to the dynamic output node for the data signal, and wherein the complementary pull-down tree is decoupled to ground by the transistor based on the control signal to disable the input data path.

4. The digital system of claim 2, wherein the input stage comprises a pull-up path coupled to the dynamic output node for precharging the dynamic output node based on the ramped clock signal, and wherein the transistor disables an input data path for the data signal without decoupling the pull-up path and the dynamic output node.

5. The digital system of claim 1, wherein the input stage further comprises a logic gate to receive the control signal and a further control signal to reset the operational state of the static memory stage.

6. The digital system of claim 1, wherein:
   the input stage further comprises a combinational logic circuit to drive the switch and a pull-down tree as an input path to the dynamic output node for the data signal; and
   wherein the combinational logic circuit further includes a test data input to receive test data, and a test-enable input to cause the operational state of the static memory stage to reflect the test data when the input path is disabled by the switch based on the control signal.

7. The digital system of claim 1, wherein the dynamic output node is coupled to the static memory stage such that a parasitic capacitance of the static memory stage promotes distribution of the ramped clock signal.

8. The digital system of claim 1, wherein the ramped clock signal provides both timing information and power to the static memory stage.

9. The digital system of claim 1, wherein the digital system comprises a memory cell comprising the static memory stage and a logic element coupled to the static memory stage and comprising the switch.

10. A method of controlling a digital system having an input stage coupled at a dynamic output node to a static memory stage having an operational state, the method comprising the steps of:
provanding a data signal and a control signal as inputs for the input stage;
providing a ramped clock signal for the input stage, the ramped clock signal defining when an update of the operational state can occur in accordance with the data signal; and,
operating a switch coupled to the dynamic output node and responsive to the control signal to prevent the update of the operational state without decoupling the ramped clock signal from the input stage.

11. The method of claim 10, wherein the control signal causes the update of the operational state to occur at a frequency derived from the ramped clock signal.

12. The method of claim 10, wherein the control signal is directed to enabling a test procedure.

13. The method of claim 12, further comprising the step of receiving a scan clock signal for reception by the input stage in connection with the test procedure.

14. The method of claim 10, wherein the input stage comprises a logic element that includes the switch and to which the control signal is provided in the operating step.

15. The method of claim 14, wherein the digital system comprises a flip-flop memory cell comprising the logic element and the static memory stage such that the logic element is embedded within the flip-flop memory cell.

16. A method of controlling a memory cell of a digital system, the memory cell having an input stage coupled at a dynamic node to a static memory stage having an operational state based on a data signal, the method comprising the steps of:
providing the data signal and a control signal as inputs for the input stage;
providing a ramped clock signal for the input stage, the ramped clock signal providing timing information for the memory cell to define when an update of the operational state can occur;
operating a switch coupled to the dynamic output node and responsive to the control signal to prevent the update of the operational state; and
continuing the ramped clock signal providing step during the operating step to facilitate recovery of clock signal energy from the digital system.

17. The method of claim 16, wherein the operating step is performed at a periodic rate determined by the control signal such that an output of the memory cell has a scaled down frequency derived from the ramped clock signal.

18. The method of claim 16, further comprising the step of accepting a test signal for the memory cell.

19. The method of claim 16, wherein the ramped clock signal further provides power to the memory cell.

20. The method of claim 16, wherein the ramped clock signal has a sinusoidal waveform.

21. The method of claim 16, wherein the digital system comprises a clock distribution network through which the clock signal is delivered to the memory cell.

22. The method of claim 16, wherein
the input stage comprises a control input to receive the control signal, and wherein the switch is coupled to the control input to prevent the update of the operational state by disabling an input data path to the dynamic output node in accordance with the control signal.

* * * * *